May 27, 1969 J. C. PRICE 3,447,090
DIGIT PULSE RETIMING ARRANGEMENT FOR A BINARY CODE GENERATOR
Filed Oct. 8, 1965
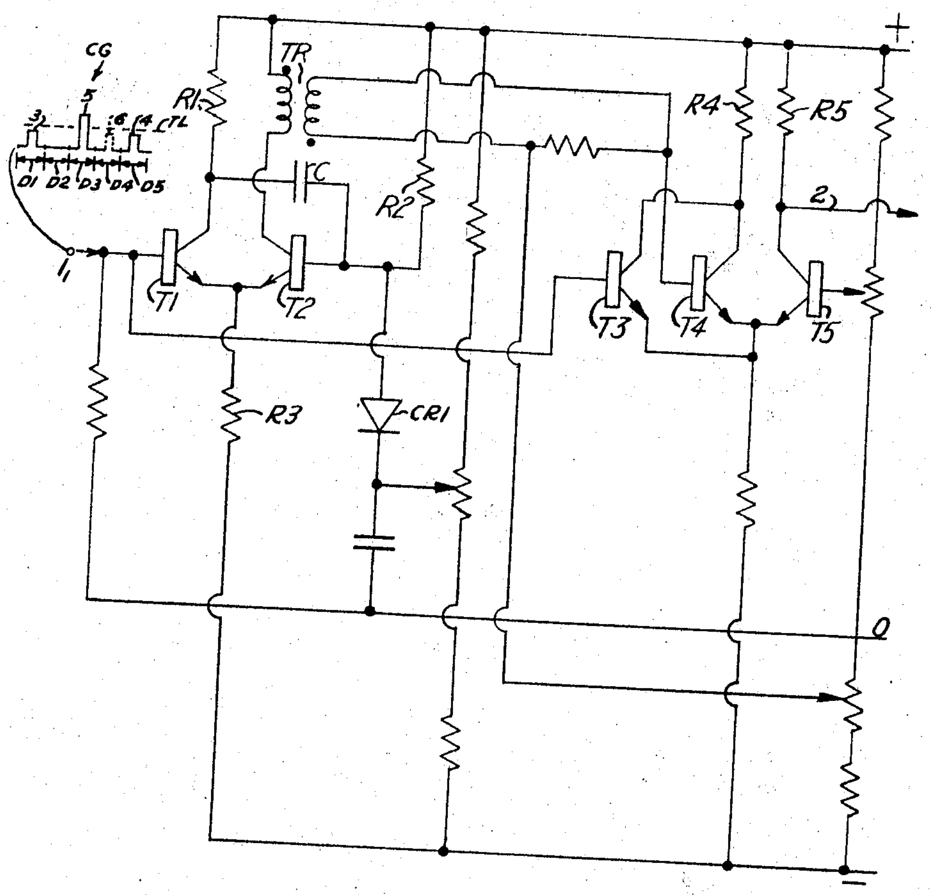
Inventor
JOHN C. PRICE
By Percy P. Lantzy
Attorney 3,447,090

DIGIT PULSE RETIMING ARRANGEMENT FOR A BINARY CODE GENERATOR

John Clifford Price, Aldwych, London, England, assignor to International Standard Electric Corporation, New York, N.Y., a corporation of Delaware Filed Oct. 8, 1965, Ser. No. 494,031
Claims priority, application Great Britain, Feb. 9, 1965, 5,552/65
Int. Cl. H03k *5/04;* H03b *1/04*
U.S. Cl. 328—164 2 Claims

ABSTRACT OF THE DISCLOSURE

In an equilibrium type coder the coding elements normally come to an equilibrium state one after another. Occasionally two adjacent coding elements come to the equilibrium state during the same digit position giving rise to an oversized amplitude pulse in a first digit position followed by a blank in the immediately following digit position rather than two normal amplitude pulses in the adjacent digit positions. This error is overcome by operating on the serial code group by a monostable circuit having a triggering level responsive to only the oversized amplitude pulse and a delay equal to the duration of a digit position and a pulse generator responsive to both the oversized amplitude pulse and the delayed output of the monostable circuit to produce the desired two normal amplitude pulses in the adjacent digit positions.

BACKGROUND OF THE INVENTION

This invention relates to a parallel-to-serial converter for a binary code generator and is concerned with the retiming of serial digit pulses.

In the copending U.S. patent application of A. H. Reeves, Ser. No. 366,778, filed May 12, 1964, now U.S. Patent No. 3,320,605, assigned to the same assignee as the present application, there is disclosed an equilibrium type of binary coder including a plurality of binary coding elements simultaneously excited by a predeterminedly clamped sine wave superimposed on a pulse amplitude modulated sample of an analog signal to be coded. The coding elements oscillate between their stable states and eventually come to an equilibrium at one of their stable states to produce in parallel a code group of digit pulses representing in coded form the sample of the analog signal. In the copending U.S. patent application of A. H. Reeves and J. C. Price, Ser. No. 495,604, filed Oct. 13, 1965, assigned to the same assignee as the present application, there is disclosed a parallel-to-serial converter operable with the equilibrium coder of the above-mentioned U.S. Patent No. 3,320,605.

In some circumstances it can happen that when a parallel pulse code group is converted into a serial code group by the above-mentioned copending application Ser. No. 495,604 two adjacent digit pulses appear in the same digit position in the serial code due to two adjacent coding elements of the above-mentioned Patent 3,320,605 coming to equilibrium in the same digit position, thus producing one oversize pulse and a blank instead of two normal pulses in adjacent digit positions. This erroneous code group make-up is inherent in the operation of the code generator and converter of the above-cited copending applications.

SUMMARY OF THE INVENTION

According to the present invention there is provided a digit pulse retiming arrangement for a binary code generator comprising a first source of serial code groups certain ones of which have in adjacent digit positions an oversized amplitude pulse and a blank in the order named rather than two normal amplitude pulses; a monostable circuit having an inverting transformer as its output circuit, a biasing arrangement to establish a trigger threshold level greater than the normal amplitude pulses and less than the oversized amplitude pulse, and a time constant circuit to produce a delay substantially equal to the duration of one digit position, the monostable circuit being coupled to the first source and triggered by only the oversized amplitude pulse; switch means coupled to the first source responsive to both the oversized amplitude pulse and the normal amplitude pulse; and a pulse generator coupled to the transformer and the switch responsive to the switch and the delayed output of the transformer to produce a pulse in each of the digit positions containing the normal and oversized amplitude pulse and a pulse in the digit position containing the blank.

BRIEF DESCRIPTION OF THE DRAWING

The invention will be described with reference to the accompanying drawing which is a circuit diagram of one embodiment of the invention.

DESCRIPTION OF THE PREFERRED EMBODIMENTS

As pointed out hereinabove under the heading "Background of the Invention," there are occasions when the equilibrium code generator and parallel-to-serial converter employed in combination produce a serial code group representing an analog signal sample including a double amplitude pulse in one digit position followed by a blank in the next following digit position. Such a code group CG is illustrated in the drawing applied to input terminal 1 of the retiming arrangement incorporating the principles of the present invention. Code group CG should represent the code 10111, but actually represents a code 10101 including, for example, normal amplitude pulses 3 and 4 in digit positions D1 and D5, a desired binary "0" in digit position D2, an oversized pulse 5 in digit position D3, and a blank in digit position D4 where a normal amplitude pulse, binary "1," should appear as indicated by dotted pulse 6.

The retiming arrangement of the present invention comprises a monostable circuit including transistors T1 and T2 and a pulse regenerator having a switch including transistor T3 and a pulse generator including transistors T4 and T5. Transistors T3, T4 and T5, the pulse regenerator, reproduces a given amplitude pulse in the blank digit position after the occurrence of an oversized amplitude pulse in the preceding adjacent digit position as well as a pulse of said given amplitude in the digit positions including the normal and oversized amplitude pulses to reconstitute the code group as it should have been generated.

The initial condition or stable condition of the monostable circuit is that transistor T1 is non-conducting, transistor T2 is conducting resulting in a low voltage at the collector of transistor T2. Additionally, resistors R1 and R3 and the positive and negative direct current voltages are selected to bias transistor T1 so as to provide a triggering threshold level TL in code group CG greater than the positive normal amplitude pulses and less than the positive oversized amplitude pulse of the code group coupled from terminal 1 to the base of transistor T1. Thus, the monostable circuit can only be triggered by the oversized pulse of the code group.

When the oversized pulse occurs, the monostable circuit is triggered to its unstable state wherein transistor T1 is conductive and transistor T2 is non-conductive resulting in a transition in the primary winding of inverting of transformer TR from a low voltage to a high voltage and a negative pulse having a duration substantially equal the duration of the pulses of code group CG at this transition in the secondary winding of transformer TR due to the inherent differentiating operation of transformer TR. A time constant circuit including capacitor C and resistors R1 and R2 is adjusted to hold the monostable circuit in its unstable state for a time equal to the duration of a digit position D. After this time the monostable circuit is returned to its stable state (the initial conditions) resulting in a transition from a high voltage to a low voltage in the primary winding of transformer TR and a positive pulse having a duration substantially equal to the duration of the original pulses of the code group CG at this transition in the secondary of transformer TR due to the inherent differentiating operation of transformer TR.

Diode CR1 and its associated circuit is a conventional amplitude limiting circuit coupled to the base of transistor T2 to prevent driving transistor T2 into saturation.

Initially transistor switch T3 is normally non-conductive and is rendered conductive for each of the pulses, both the oversized pulse 5 or normal amplitude pulses 3 and 4, of code group CG coupled from terminal 1 to the base of transistor T3. Transistor T3 will remain non-conductive in the presence of the binary "0" condition in digit position D2 and in the presence of the blank in digit position D4.

Initially, transistor T4 is non-conductive and transistor T5 is conductive resulting in a low voltage output at output conductor 2. These transistors will remain in these initial conditions for a binary "0" condition, such as in digit position D2. When transistor T3 is switched to conduction by each of pulses 3, 4 and 5 of code group CG the emitter current is switched from the collector load, resistor R5, of transistor T5 to the common collector load, resistor R4, of transistors T3 and T4. This results in a high voltage output at conductor 2 for the duration that the code group pulses maintain transistor T3 conductive. Thus, normal pulses 3 and 4 and oversized pulse 5 are regenerated by transistors T4 and T5 each having the same amplitude as determined by the biasing arrangement therefore. These regenerated pulses appear on output conductor 2.

When the blank appears in the digit position immediately after the digit position containing the oversized pulse, there is a positive pulse applied to the base of transistor T4 from transformer TR. This positive pulse is the result of the monostable circuit returning to its stable condition after the one digit position duration delay from the time the oversized amplitude pulse triggered the monostable circuit to its unstable condition. This positive pulse will render transistor T4 conductive and T5 non-conductive resulting in the regeneration of pulse 6 in the digit position D4 that originally contained a blank in code group CG. The negative pulse from transformer TD at the time the monostable circuit is triggered from its stable state to its unstable state will not trigger transistor T4 due to its polarity. Therefore, transistors T4 and T5 are switched only once when a normal amplitude pulse is received and is switched twice in succeeding pulse periods when an oversized pulse is received to regenerate the digit pulse sequence that should have been generated by the parallel-to-serial converter of the above-mentioned copending application, Ser. No. 495,604.

It is to be understood that the foregoing description of specific examples of this invention is made by way of example only and is not to be considered as a limitation of its scope.

What we claim is:

1. A digit pulse retiming arrangement for a binary code generator comprising:

a first source of serial code groups contain ones of which have in adjacent digit positions an oversized amplitude pulse and a blank in the order named rather than two normal amplitude pulses;

a monostable circuit having an inverting transformer as its output circuit, a biasing arrangement to establish a trigger threshold level greater than said normal amplitude pulses and less than said oversized amplitude pulses, and a time constant circuit to produce a delay substantially equal to the duration of one digit position, said monostable circuit being coupled to said first source and triggered only by said oversized amplitude pulse;

a switch coupled to said first source responsive to both said oversized amplitude pulse and said normal amplitude pulse; and a pulse generator coupled to said transformer and said switch responsive to said switch and the delayed output of said transformer to produce a pulse in each of the digit positions containing said normal and oversized amplitude pulses and a pulse in the digit position containing said blank.

2. An arrangement according to claim 1, wherein:

said pulse generator includes

- a second source of positive direct current voltage,
- a third source of negative direct current voltage,
- a first transistor having its base coupled to said transformer, its collector coupled to one of said second and third sources, and its emitter coupled to the other of said second and third sources,
- a voltage divider coupled to said second and third sources,
- a second transistor having its base coupled to said voltage divider, its collector coupled to said one of said second and third sources, and its emitter coupled to said emitter of said first transistor, and
- an output coupled to said collector of said second transistor; and said switch includes

- a third transistor having its base coupled to said first source, its collector coupled to said collector of said first transistor, and its emitter coupled to said emitters of both said first and second transistors.

References Cited

UNITED STATES PATENTS

| | | | |
|---|---|---|---|
| 2,390,608 | 12/1945 | Miller | 328—38 |
| 2,493,379 | 1/1950 | Anderson | 328—38 |
| 2,551,529 | 5/1951 | Davis | 328—117 |
| 2,967,951 | 1/1961 | Brown | 307—273 |
| 2,990,480 | 6/1961 | Ellsworth | 307—273 |
| 3,167,716 | 1/1965 | Williams | 328—38 |
| 3,226,660 | 12/1965 | Bachelor | 328—38 |
| 3,319,170 | 5/1967 | Harmer | 328—117 |
| 3,327,230 | 6/1967 | Konian | 328—61 |

ARTHUR GAUSS, *Primary Examiner.*

H. DIXON, *Assistant Examiner.*

U.S. Cl. X.R.

307—235, 261; 328—117